(12) United States Patent
Umada et al.

(10) Patent No.: US 10,968,521 B2
(45) Date of Patent: Apr. 6, 2021

(54) GRAIN-ORIENTED ELECTRICAL STEEL SHEET AND PRODUCTION METHOD FOR GRAIN-ORIENTED ELECTRICAL STEEL SHEET

(71) Applicant: JFE Steel Corporation, Tokyo (JP)

(72) Inventors: Takumi Umada, Tokyo (JP); Shigehiro Takajo, Tokyo (JP); Takashi Terashima, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/471,176

(22) PCT Filed: Dec. 6, 2017

(86) PCT No.: PCT/JP2017/043795
§ 371 (c)(1),
(2) Date: Jun. 19, 2019

(87) PCT Pub. No.: WO2018/116831
PCT Pub. Date: Jun. 28, 2018

(65) Prior Publication Data
US 2019/0390350 A1 Dec. 26, 2019

(30) Foreign Application Priority Data
Dec. 21, 2016 (JP) .............................. JP2016-248230

(51) Int. Cl.
*C22C 38/00* (2006.01)
*C22C 38/02* (2006.01)
(Continued)

(52) U.S. Cl.
CPC ............ *C23C 28/04* (2013.01); *C22C 38/001* (2013.01); *C22C 38/02* (2013.01); *C22C 38/04* (2013.01);
(Continued)

(58) Field of Classification Search
CPC ......... C23C 16/34; C23C 22/00; C23C 22/07; C23C 28/04; C23C 14/06; C22C 38/001;
(Continued)

(56) References Cited

U.S. PATENT DOCUMENTS

| 2009/0233114 A1 | 9/2009 | Takeda et al. |
| 2013/0251984 A1* | 9/2013 | Schepers ............... C21D 8/1283 428/336 |

(Continued)

FOREIGN PATENT DOCUMENTS

| CN | 101443479 A | 5/2009 |
| EP | 0260927 A2 | 3/1988 |

(Continued)

OTHER PUBLICATIONS

International Search Report and Written Opinion for International Application No. PCT/JP2017/043795, dated Jan. 16, 2018—6 pages.

(Continued)

*Primary Examiner* — Daniel J. Schleis
*Assistant Examiner* — Kevin CT Li
(74) *Attorney, Agent, or Firm* — RatnerPrestia

(57) ABSTRACT

Provided are: a grain-oriented electrical steel sheet that has excellent coating adhesiveness and an excellent magnetic property after stress relief annealing; and a production method for therefor. The grain-oriented electrical steel sheet has: a steel sheet; a coating layer A which is a ceramic coating having an oxide content of less than 30 mass % and which is disposed on the steel sheet; and a coating layer B which is an insulating tensile coating containing an oxide and which is disposed on the coating layer A. When a Gaussian fitting is performed on a $^{31}$P-NMR spectrum of the coating layer B within the range of 0 to −60 ppm, the proportion of a peak area of −17 to −33 ppm to the total peak area is 30% or more.

19 Claims, 2 Drawing Sheets

(51) Int. Cl.
  *C22C 38/04* (2006.01)
  *C22C 38/06* (2006.01)
  *C23C 16/34* (2006.01)
  *C23C 22/07* (2006.01)
  *C23C 28/04* (2006.01)
  *H01F 1/18* (2006.01)

(52) U.S. Cl.
  CPC .............. *C22C 38/06* (2013.01); *C23C 16/34* (2013.01); *C23C 22/07* (2013.01); *H01F 1/18* (2013.01)

(58) Field of Classification Search
  CPC ......... C22C 38/02; C22C 38/04; C22C 38/06; C22C 38/00; C22C 38/60; H01F 1/18; H01F 1/147; H01F 1/16; C21D 8/12; C21D 9/46
  See application file for complete search history.

(56) References Cited

U.S. PATENT DOCUMENTS

| | | | |
|---|---|---|---|
| 2014/0245926 A1* | 9/2014 | Muraki | C21D 9/46 106/286.6 |
| 2015/0368158 A1 | 12/2015 | Lemaître et al. | |
| 2018/0002773 A1 | 1/2018 | Shingaki et al. | |

FOREIGN PATENT DOCUMENTS

| | | |
|---|---|---|
| EP | 2799594 A1 | 11/2014 |
| JP | 6468425 A | 3/1989 |
| JP | 01147074 A | 6/1989 |
| JP | 01176034 A | 7/1989 |
| JP | 2003129196 A * | 5/2003 |
| JP | 2005240157 A | 9/2005 |
| JP | 2016507006 A | 3/2016 |
| WO | 2016104813 A1 | 6/2016 |
| WO | 2018097100 A1 | 5/2018 |

OTHER PUBLICATIONS

Japanese Concise Statement of Relevance of Office Action for Japanese Application No. 2018-513028, dated May 22, 2018—7 pages.
Panjan et al., "Oxidation of TiN, ZrN, TiZrN, CrN, TiCrN and TiN/CrN multilayer hard coatings reactively sputtered at low temperature", Thin Solid Films, 281-282, Aug. 1996—pp. 298-301.
Extended European Search Report for European Application No. 17 885 024.4, dated Jul. 24, 2019, 8 pages.
Chinese Office Action with Search Report for Chinese Application No. 201780073550.8, dated Oct. 22, 2020, 9 pages.
Korean Office Action for Korean Application No. 10-2019-7016169, dated Feb. 4, 2021, with Concise Statement of Relevance of Office Action, 7 pages.

* cited by examiner

GRAIN-ORIENTED ELECTRICAL STEEL SHEET AND PRODUCTION METHOD FOR GRAIN-ORIENTED ELECTRICAL STEEL SHEET

CROSS REFERENCE TO RELATED APPLICATIONS

This is the U.S. National Phase application of PCT/JP2017/043795, filed Dec. 6, 2017, which claims priority to Japanese Patent Application No. 2016-248230, filed Dec. 21, 2016, the disclosures of each of these applications being incorporated herein by reference in their entireties for all purposes.

FIELD OF THE INVENTION

The present invention relates to a grain oriented electrical steel sheet and a producing method of a grain oriented electrical steel sheet.

BACKGROUND OF THE INVENTION

Grain oriented electrical steel sheets are soft magnetic materials used as materials for iron cores of transformers, generators and the like. Grain oriented electrical steel sheets are characterized in having a crystal structure in which the <001> orientation that is an easy magnetization axis of iron is highly-precisely aligned in the rolling direction of the steel sheet. The texture as above is formed through finishing annealing of a manufacturing process of a grain oriented electrical steel sheet, which finishing annealing allows crystal grains with the {110}<001> orientation referred to as the so-called Goss orientation to preferentially grow to an enormous size. Grain oriented electrical steel sheets as products are required to have such magnetic properties as high magnetic flux density and low iron loss.

The magnetic properties of a grain oriented electrical steel sheet are improved by applying a tensile stress (tension) to a steel sheet surface. As one conventional technique of applying a tensile stress to a steel sheet, a technique in which a forsterite coating of about 2 μm thickness is formed on a steel sheet surface and another coating of about 2 μm thickness primarily composed of silicon phosphate is formed on the forsterite coating is typically used.

To be more specific, the silicon phosphate coating having a lower thermal expansion coefficient than that of the steel sheet is formed at high temperature and cooled to room temperature, whereby a tensile stress is applied to the steel sheet using a difference in thermal expansion coefficient between the steel sheet and the silicon phosphate coating.

This silicon phosphate coating also acts as an insulating coating that is indispensable for a grain oriented electrical steel sheet. Owing to the insulation, a local eddy current is prevented from being generated in the steel sheet.

A surface of the grain oriented electrical steel sheet having undergone finishing annealing is smoothed by chemical polishing or electrolytic polishing, and then a tensile stress is applied by means of the coating above the steel sheet, whereby iron loss can remarkably be decreased.

Meanwhile, the forsterite coating between the steel sheet and the silicon phosphate coating adheres to the steel sheet owing to the anchoring effect. Therefore, the smoothness of the steel sheet surface inevitably deteriorates. The adhesion between silicon phosphate and metal is so low that a silicon phosphate coating cannot be formed directly on a mirror-finished surface of a steel sheet. Thus, in the coating structure of a conventional grain oriented electrical steel sheet (steel sheet/forsterite coating/silicon phosphate coating), a surface of a steel sheet cannot be smoothed.

In Patent Literature 1, in order to maintain the smoothness of a steel sheet surface and also apply a large tensile stress to the steel sheet, a ceramic coating made of TiN for instance is formed on the steel sheet by a CVD method or a PVD method. At this time, since a tensile stress applied to the steel sheet is proportional to the thickness of the ceramic coating, the ceramic coating is formed to have a thickness of at least 1 μm.

CVD methods and PVD methods, however, cause high manufacturing costs, and accordingly, coatings are desired to have a small thickness to the utmost extent, which in turn results in a decrease in tensile stress applied to a steel sheet.

In Patent Literature 2, to compensate a decrease in tension due to such a small coating thickness or to apply a much higher tension to a steel sheet, an insulation tension coating made of silicon phosphate is formed on a ceramic coating with a thickness of 1 μm or less.

PATENT LITERATURES

Patent Literature 1: JP 01-176034 A
Patent Literature 2: JP 64-068425 A

SUMMARY OF THE INVENTION

The present inventors studied a grain oriented electrical steel sheet in which an insulation tension coating was formed on a ceramic coating. As a result, it was found that when a demander or the like subjects the grain oriented electrical steel sheet to stress relief annealing, this sometimes causes the ceramic coating to peel off from the associated steel sheet or results in poor magnetic properties of the grain oriented electrical steel sheet.

The present invention has been made in view of the above and aims at providing a grain oriented electrical steel sheet having excellent coating adhesion property and magnetic properties after stress relief annealing, as well as a producing method thereof.

The present inventors have made an intensive study to achieve the foregoing objects and as a result found that, when specific coating structures are employed for a ceramic coating and an insulation tension coating, the coating adhesion property and the magnetic properties are both excellent even after stress relief annealing. The invention has been thus completed.

Specifically, embodiments of the present invention provides the following [1] to [13].

[1] A grain oriented electrical steel sheet, comprising:
a steel sheet;
a coating layer A that is a ceramic coating containing an oxide in an amount of less than 30 mass % and disposed on the steel sheet; and
a coating layer B that is an insulation tension coating containing an oxide and disposed on the coating layer A,
wherein when Gaussian fitting is performed on a $^{31}$P-NMR spectrum of the coating layer B within a range of 0 to −60 ppm, a peak area in a range of −17 to −33 ppm accounts for 30% or more of a total peak area.

[2] The grain oriented electrical steel sheet according to [1] above,
wherein the coating layer B includes not less than 5 mass % of crystal phase.

[3] The grain oriented electrical steel sheet according to [2] above, wherein the crystal phase is a phosphate crystal phase.
[4] The grain oriented electrical steel sheet according to any one of [1] to [3] above,
wherein the coating layer A has a thickness of not less than 0.01 μm.
[5] The grain oriented electrical steel sheet according to any one of [1] to [4] above,
wherein the coating layer A has a thickness of not more than 0.30 μm.
[6] The grain oriented electrical steel sheet according to any one of [1] to [5] above,
wherein the coating layer B has a thickness of not less than 1.0 μm.
[7] The grain oriented electrical steel sheet according to any one of [1] to [6] above,
wherein the coating layer B has a thickness of not more than 10.0 μm.
[8] The grain oriented electrical steel sheet according to any one of [1] to [7] above,
wherein the coating layer A contains a nitride or a carbonitride.
[9] A grain oriented electrical steel sheet producing method of producing the grain oriented electrical steel sheet according to any one of [1] to [8] above,
wherein the coating layer B is formed by applying a coating chemical solution onto the coating layer A and baking the coating chemical solution in a nitrogen atmosphere.
[10] The grain oriented electrical steel sheet producing method according to [9] above,
wherein an amount of phosphoric acid and/or phosphate in the coating chemical solution is not less than 20 mol % with respect to total solids of the coating chemical solution.
[11] The grain oriented electrical steel sheet producing method according to [9] or [10] above,
wherein the baking is followed by crystallization using laser light or photoinduction, thereby obtaining the coating layer B.
[12] The grain oriented electrical steel sheet producing method according to any one of [9] to [11] above,
wherein the coating chemical solution is applied with an application roll.
[13] The grain oriented electrical steel sheet producing method according to any one of [9] to [12],
wherein the coating layer A is formed by a chemical vapor deposition method or a physical vapor deposition method.

The present invention can provide a grain oriented electrical steel sheet having excellent coating adhesion property and magnetic properties after stress relief annealing, as well as a producing method thereof.

DETAILED DESCRIPTION OF EMBODIMENTS OF THE INVENTION

Figure 1:
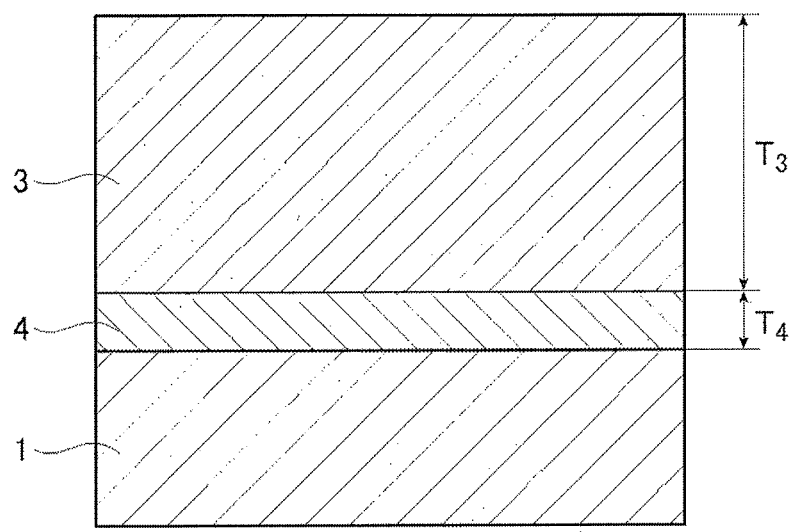
FIG. 1 is a cross-sectional view schematically showing a preferred embodiment of a grain oriented electrical steel sheet of the invention.

[Findings Obtained by Inventors]
A ceramic coating with a thickness of not more than 1.00 μm (e.g., 0.30 μm) was formed on a steel sheet, and an insulation tension coating made of silicon phosphate was formed thereon; when the resulting steel sheet was subjected to stress relief annealing, the ceramic coating peeled off from the steel sheet (i.e., the coating adhesion property deteriorated) in some cases. The present inventors conducted many experiments to find out why this occurred and now have the following ideas.

The use of silicon phosphate having a low thermal expansion coefficient as a material for the insulation tension coating is advantageous for increasing a tensile stress applied by the insulation tension coating to the associated steel sheet and thereby improving the magnetic properties, while components in the insulation tension coating oxidize the ceramic coating under a high temperature environment, thus generating reaction products.

Subsequently, the reaction products diffuse in the ceramic coating from the interface between the insulation tension coating and the ceramic coating toward the steel sheet during stress relief annealing at 800° C. for 3 hours; when the reaction products further diffuse and reach the interface between the ceramic coating and the steel sheet, they react with Fe of the steel sheet and form precipitates.

Then, during a cooling process in stress relief annealing, i.e., when a stress starts to be applied to the interface between the steel sheet and the ceramic coating due to a difference in thermal expansion coefficient, the precipitates cannot fully receive the stress and consequently peel off from the steel sheet. Thus, the ceramic coating peels off from the steel sheet. In other words, the coating adhesion property deteriorates.

To cope with it, the present inventors considered suppressing the oxidation reaction of the ceramic coating (e.g., nitride-containing ceramic coating) caused by the insulation tension coating containing an oxide.

The oxidizing ability of oxides can be explained using the electronegativity. To be more specific, when such bonds as P—O—P, P—O—Si and P—O-M (M: metal) are taken as an example, a P—O—P bond including a larger amount of P which is the most electronegative element should be most unlikely to cause an oxidation reaction. Accordingly, when a phosphorus oxide in the insulation tension coating has chain structure of —P—O—P—O—P— and the like, the oxidizing ability of the phosphorus oxide decreases.

The structure of glass is typically evaluated using $^{31}$P-NMR (Nuclear Magnetic Resonance). In a $^{31}$P-NMR spectrum, when a peak appears in a chemical shift range of not more than −17 ppm, the peak can be determined to indicate one of the chain structures of phosphorus oxides called $Q^2$ and $Q^3$ expressed by the formulae shown below (T. Kasuga, *Journal of the Society of Inorganic Materials Japan* 10 (2003) 189.).

[Chemical Formula 1]

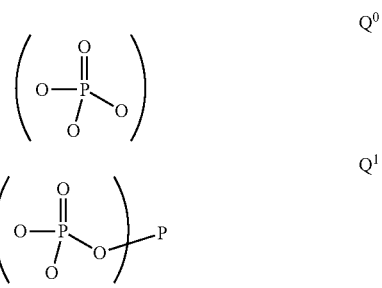

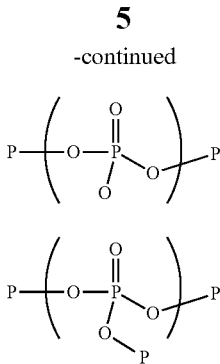

The present inventors formed, after finishing annealing, a ceramic coating made of a nitride and other components and having a thickness of not larger than 0.30 μm on a steel sheet from whose surface a forsterite coating had been removed by pickling. Thereafter, a coating chemical solution was applied on the ceramic coating with an application roll and baked in a nitrogen atmosphere, thereby forming an insulation tension coating. Then, stress relief annealing was carried out at 800° C. for 3 hours in a nitrogen atmosphere.

At this time, the present inventors performed Gaussian fitting on a $^{31}$P-NMR spectrum of the insulation tension coating within a range of 0 to −60 ppm and as a result found that, when the peak area in a range of −17 to −33 ppm accounts for 30% or more of the total peak area, even if the thickness of the ceramic coating is 1.00 μm or less, an excellent coating adhesion property can be maintained after stress relief annealing.

Figure 2:
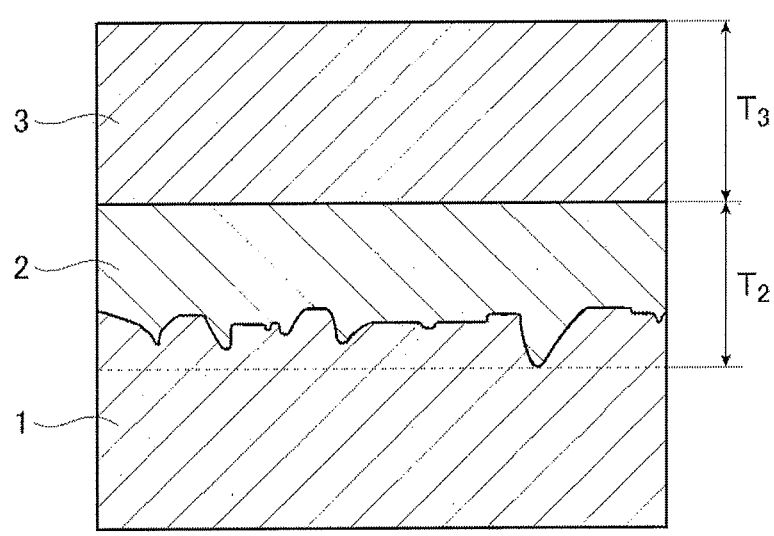
FIG. 2 is a cross-sectional view schematically showing a conventional grain oriented electrical steel sheet.

FIG. 1 is a cross-sectional view schematically showing a preferred embodiment of a grain oriented electrical steel sheet of the invention. FIG. 2 is a cross-sectional view schematically showing a conventional grain oriented electrical steel sheet.

First, as shown in FIG. 2, the conventional grain oriented electrical steel sheet is typically configured such that a forsterite coating 2 is disposed on a steel sheet 1 and an insulation tension coating 3 is formed on the forsterite coating. In FIG. 2, the thickness $T_2$ of the forsterite coating 2 is about 2 μm, and the thickness $T_3$ of the insulation tension coating 3 is about 2 μm.

On the other hand, in FIG. 1, the forsterite coating 2 in the conventional case (see FIG. 2) is replaced by a ceramic coating 4. To be more specific, the ceramic coating 4 is formed by a CVD method or a PVD method on a surface of the steel sheet 1 having been smoothed by chemical polishing, electrolytic polishing or another method. Since the thickness $T_4$ of the ceramic coating 4 in FIG. 1 is for example not more than 1.00 μm, even if the thickness $T_3$ of the insulation tension coating 3 is increased to 2.0 μm or more, the effective steel sheet volume (lamination factor) of the grain oriented electrical steel sheet when used as a transformer is not decreased.

Since a tension applied by a coating to a steel sheet is usually proportional to the thickness of the coating, increasing the thickness of the insulation tension coating should be effective at improving the magnetic properties.

The present inventors found that, by adjusting the rotational speed of an application roll, the specific gravity of a coating chemical solution, or another factor to thereby increase the thickness of the resulting insulation tension coating, a tension applied to the associated steel sheet is increased, and thus, the resulting grain oriented electrical steel sheet can have improved magnetic properties.

[Grain Oriented Electrical Steel Sheet and Producing Method Thereof]

Again, the grain oriented electrical steel sheet according to embodiments of the invention is described below.

The grain oriented electrical steel sheet according to an embodiment of the invention is a grain oriented electrical steel sheet comprising a steel sheet, a coating layer A that is a ceramic coating containing an oxide in an amount of less than 30 mass % and disposed on the steel sheet, and a coating layer B that is an insulation tension coating containing an oxide and disposed on the coating layer A, wherein, when Gaussian fitting is performed on a $^{31}$P-NMR spectrum of the coating layer B within a range of 0 to −60 ppm, a peak area in a range of −17 to −33 ppm accounts for 30% or more of a total peak area.

The grain oriented electrical steel sheet of the invention is excellent in the coating adhesion property after stress relief annealing (hereinafter also simply called "coating adhesion property") as well as in the magnetic properties after stress relief annealing (hereinafter also simply called "magnetic properties").

The grain oriented electrical steel sheet of the invention is described below in further detail. The following description also covers the producing method of a grain oriented electrical steel sheet according to embodiments of the present invention.

<Steel Sheet>

The type of a steel sheet is not particularly limited, and a steel sheet described below is one example.

As the ingot that forms a steel sheet, an ingot containing, as components in steel, in percentage by mass, C in an amount from 0.002% to 0.10%, Si in an amount from 2.5% to 4.0% and Mn in an amount from 0.005% to 0.50% and also containing Al in an amount from 0.010% to 0.050% and N in an amount from 0.003% to 0.020% or Al in an amount from 0.010% to 0.050%, N in an amount from 0.003% to 0.020%, Se in an amount from 0.003% to 0.030% and/or S in an amount from 0.002% to 0.03%, with the balance being inevitable impurities and Fe is preferably used for the sake of the magnetic properties. However, the ingot for use is not limited thereto.

Such an ingot is subjected to hot rolling and then several times of cold rolling with several times of annealing performed therebetween, to thereby obtain a final cold rolled steel sheet, which is in turn subjected to decarburization annealing and finishing annealing to allow secondary recrystallized grains having the Goss orientation to develop. Thus, a steel sheet is obtained. In this process, the number of times of cold rolling is preferably up to two times for achieving the balance between the magnetic properties and the cost.

Of the foregoing components in steel, C is removed through decarburization annealing, and Al, N, Se and S are purified through finishing annealing, so that these components are to be contained in the steel sheet having undergone finishing annealing in trace amounts that can be regarded as the amount of inevitable impurities.

Thereafter, a forsterite coating on a steel sheet surface is removed by pickling or another method.

Thus, it is preferred from the manufacturing aspect that, as conventionally carried out, a forsterite coating be formed on a steel sheet surface and thereafter removed by pickling. Although the formation of a forsterite coating is favorable for decarburization of a steel sheet, when another decarburization method is employed, a forsterite coating need not be formed.

After the forsterite coating is removed from the steel sheet surface, the steel sheet surface is smoothed by a method such as chemical polishing or electrolytic polishing.

Usually, as a steel sheet surface condition is rougher, the coating adhesion property further improves owing to the anchoring effect. In contrast, as a steel sheet surface condition is smoother, a magnetic domain moves more easily, and the amount of improvement in the magnetic properties when a tension stress is applied increases, accordingly.

In the present invention, even when use is made of a steel sheet having undergone chemical polishing that can smooth a steel sheet surface the most, the coating layer A (ceramic coating) does not peel off after stress relief annealing, and thus, an excellent coating adhesion property is maintained. Therefore, it is preferable to smooth a steel sheet surface to the extent possible by chemical polishing or electrolytic polishing so as to achieve an arithmetic mean roughness Ra of not more than 0.4 μm.

<Coating Layer A: Ceramic Coating>

The grain oriented electrical steel sheet according to an embodiment of the invention has the coating layer A that is a ceramic coating disposed on a surface of the steel sheet as above.

<<Composition>>

(Oxide)

The amount of oxide in the coating layer A (ceramic coating) is less than 30 mass %, preferably not more than 15 mass %, more preferably not more than 5 mass % and even more preferably not more than 2 mass % because when the lattice of the ceramic coating matches the body-centered cubic lattice of the steel sheet, a more excellent coating adhesion property can be achieved.

The amount of oxide in the ceramic coating can be measured with X-ray fluorescence using a reference sheet having a known composition.

Exemplary elements in the oxide other than oxygen (O) include those listed as elements in a non-oxide other than C and N, which is described below.

(Non-Oxide)

A component (a component other than the oxide) contained in the coating layer A (ceramic coating) is at least one selected from the group consisting of a carbide, a nitride and a carbonitride, for example.

When the ceramic coating contains a nitride or a carbonitride, the coating adhesion property is further improved.

When the non-oxide is at least one selected from the group consisting of a carbide, a nitride and a carbonitride, an exemplary element in the non-oxide other than C and N is at least one selected from the group consisting of Cr, Ti, Al, Si, Zr, Mo, Y, Nb, W, Fe, Mn, Ta, Ge and Hf, and of these, at least one selected from the group consisting of Cr, Ti, Al, Si, Zr, Mo, Y, Nb and W is preferred.

For the non-oxide, a nitride or a carbonitride having a rock salt structure is preferred for the reason that this easily matches the body-centered cubic lattice of the steel sheet.

The non-oxide is preferably a component contributing to maximum improvement in oxidation resistance of a nitride or the like in the ceramic coating. According to the Arrhenius plot formulated by P. Panjan et al. (P. Panjan et al., *Thin Solid Films* 281-282 (1996) 298.), the addition of Ti or the like to a Cr-containing nitride can bring about increased oxidation resistance. Accordingly, a non-oxide such as a nitride containing three or more elements, e.g., TiCrN or AlCrN, can also be favorably used.

The amount of non-oxide in the ceramic coating is preferably not less than 70 mass %. It is preferable that the ceramic coating be substantially made of the non-oxide.

In the present invention, a value obtained by subtracting the amount of oxide from the total mass of the ceramic coating can be regarded as the amount of non-oxide in the ceramic coating.

<<Thickness>>

The thickness of the coating layer A (ceramic coating) is preferably not more than 1.00 μm and more preferably not more than 0.30 μm for the sake of suppressing an increase in cost.

On the other hand, the thickness of the ceramic coating is preferably not less than 0.01 μm because the coating adhesion property becomes more excellent.

For the thickness of the ceramic coating, a flake (cross-section) cut out using FIB (Focused Ion Beam) is observed with a TEM (Transmission Electron Microscope), and the average of measurements at given ten places is obtained.

<<Coating Formation Method>>

The method of forming the coating layer A (ceramic coating) is preferably a CVD (Chemical Vapor Deposition) method or a PVD (Physical Vapor Deposition) method.

A preferred CVD method is a thermal CVD method. The coating formation temperature is preferably from 900° C. to 1100° C. While the coating can be formed in the atmospheric pressure, it is preferable to reduce pressure for uniform coating formation, and thus, the pressure during coating formation is more preferably 10 to 1000 Pa for manufacturing reasons.

A preferred PVD method is an ion plating method. The coating formation temperature is preferably from 300° C. to 600° C. for manufacturing reasons. The pressure during coating formation is preferably reduced and more preferably 0.1 to 100 Pa. During the coating formation, a bias voltage of −10 to −100 V is preferably applied with the steel sheet serving as the cathode. Plasma is preferably used for ionization of a raw material because this leads to a higher coating formation rate.

When a ceramic coating containing three or more elements, such as TiAlN or TiCrN, is formed, preferred coating formation methods are PVD methods, with the ion plating method being more preferred. When a CVD method utilizing a thermodynamic reaction for coating formation is used, it is sometimes difficult to obtain a desired composition; since a PVD method ionizes an alloy material and allows the material to coherently precipitate, a desired composition can easily be obtained.

<Coating Layer B: Insulation Tension Coating>

The grain oriented electrical steel sheet according to an embodiment of the invention has the coating layer B that is an insulation tension coating containing an oxide and disposed on the coating layer A (ceramic coating).

<<Peak Area Proportion>>

When Gaussian fitting is performed on a $^{31}$P-NMR spectrum of the coating layer B (insulation tension coating) within a range of 0 to −60 ppm, the proportion of the peak area in a range of −17 to −33 ppm (hereinafter called "peak area proportion" for convenience) with respect to the total peak area is 30% or more.

With this configuration, the grain oriented electrical steel sheet of the invention can have excellent magnetic properties in addition to an excellent coating adhesion property.

Figure 4:
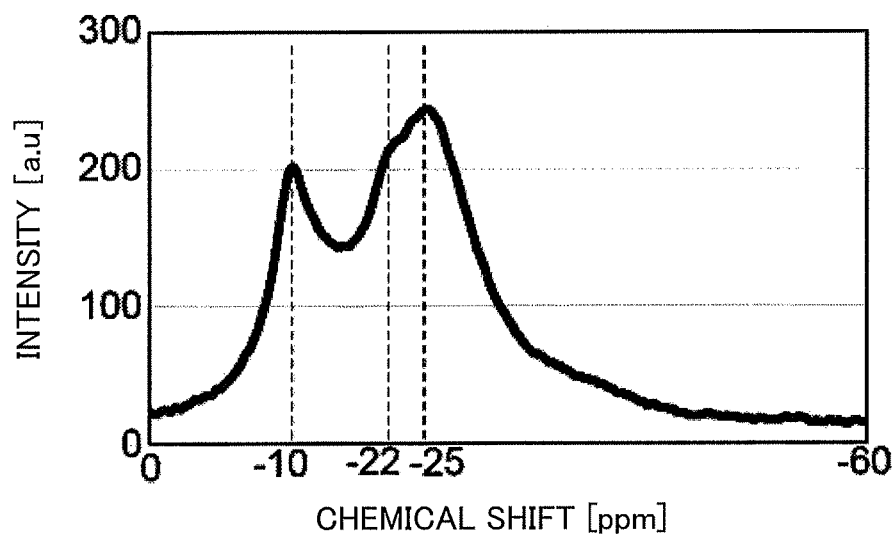
FIG. 4 shows an example of a $^{31}$P-NMR spectrum of an insulation tension coating.

Taking the $^{31}$P-NMR spectrum shown in FIG. 4 as an example, the method of determining the peak area proportion above is described in further detail. FIG. 4 shows an example of a $^{31}$P-NMR spectrum of the coating layer B (insulation tension coating). The conditions for $^{31}$P-NMR spectrum measurement are as follows: the apparatus is VNS 600 manufactured by Agilent Technologies, Inc.; the measurement temperature is room temperature; the rotational speed is 7 kHz; and the reference sample is ammonium dihydrogenphosphate.

In FIG. 4, three peaks are observed in a $^{31}$P chemical shift range of 0 to −60 ppm. That is, the three peaks are present with their peak tops being at −10 ppm, −22 ppm and −25 ppm in order from left in FIG. 4.

Gaussian fitting is performed for each peak to separate the peaks, and the peak area of each separated peak is obtained. In FIG. 4, the sum of the peak areas of the three peaks above is the "total peak area."

The sum of the peak areas of peaks with their peak tops being positioned within a range of "−17 to −33 ppm" (in FIG. 4, the two peaks with their peak tops being at −22 ppm and −25 ppm) is the "peak area in a range of −17 to −33 ppm."

Then, the proportion of the "peak area in a range of −17 to −33 ppm" with respect to the "total peak area" (i.e., peak area proportion) is obtained.

The peak area proportion is preferably not less than 30%, more preferably not less than 40% and even more preferably not less than 60% because the grain oriented electrical steel sheet of the invention can have more excellent coating adhesion property and magnetic properties.

The upper limit of the peak area proportion is not particularly limited and is, for instance, 80% or less.

<<Crystal Phase>>

As described below, in order to have a peak area proportion of not less than 30%, it is preferable to crystallize the insulation tension coating, and accordingly, the insulation tension coating preferably includes a crystal phase.

The crystal phase content of the insulation tension coating is preferably not less than 5 mass %, more preferably not less than 10 mass % and even more preferably not less than 15 mass %. The upper limit thereof is not particularly limited and is, for instance, not more than 50 mass % and preferably not more than 40 mass %.

For the quantitative method of the crystal phase, methods using X-ray diffraction are simple and easy, and exemplary methods include: a quantitative method using an integrated intensity ratio of a crystalline component to an amorphous component; a quantitative method using the calibration curve of a reference sample prepared in advance; and a quantitative method using an integral intensity ratio of the crystal phase to a reference material.

The crystal phase in the insulation tension coating is preferably a phosphate crystal phase.

The phosphate (composition of the phosphate) is suitably determined in accordance with a component or components contained in a coating chemical solution for use, and examples thereof include, but not limited to, $Mg_2P_2O_7$, $Ca_2P_2O_7$, $Sr_2P_2O_7$, $Ba_2P_2O_7$, $Al_2P_2O_8$, $Y_2P_2O_8$, $Cr_2P_2O_8$, $Ti_3P_4O_{16}$, $Zr_3P_4O_{16}$, $Mn_3P_4O_{16}$, $NbPO_5$, $VPO_5$ and $WP_2O_8$.

The crystal phase is identified using, for instance, X-ray diffraction.

<<Composition>>

The coating layer B (insulation tension coating) contains an oxide.

The amount of oxide of phosphorus ($P_2O_5$) in the insulation tension coating is preferably from 25 to 55 mass % and more preferably from 35 to 45 mass %.

The amount of oxide of silicon ($SiO_2$) in the insulation tension coating is preferably from 42 to 58 mass % and more preferably from 48 to 58 mass %.

In addition, the amount of oxide of element other than P and Si (e.g., MgO, CaO, SrO, BaO, $Al_2O_3$, $Y_2O_3$, $Cr_2O_3$, $TiO_2$, $ZrO_2$, $MnO_2$, $Nb_2O_5$, $V_2O_5$, $WO_3$) in the insulation tension coating is preferably from 2 to 18 mass % and more preferably from 2 to 12 mass %.

The amounts of the foregoing oxides in the insulation tension coating can be measured by X-ray fluorescence spectrometry using a reference sheet with an insulation tension coating having a known composition.

In the present description, the oxides as above in the insulation tension coating are sometimes collectively called "silicon phosphate."

<<Thickness>>

Figure 3:
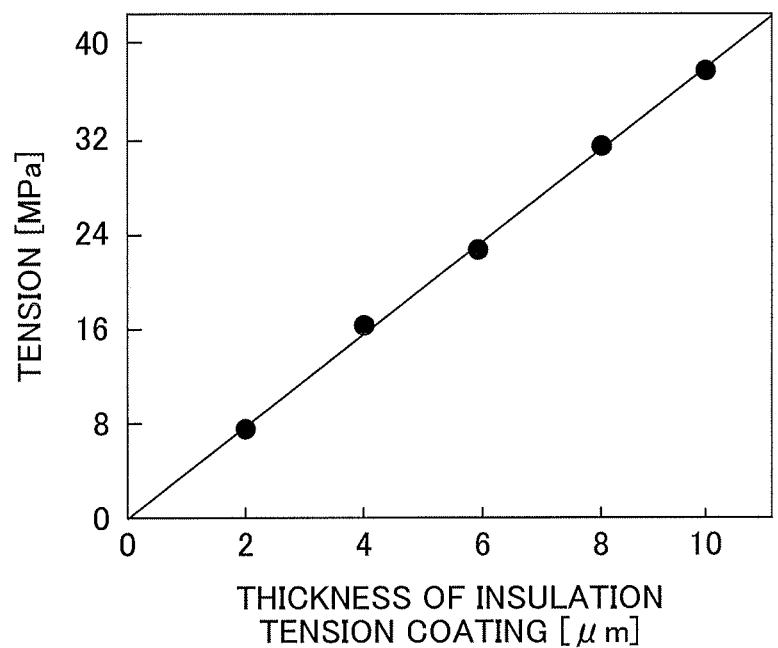
FIG. 3 is a graph showing the relationship between the thickness of an insulation tension coating and the tension that the insulation tension coating with the relevant thickness applies to the associated steel sheet.

FIG. 3 is a graph showing the relationship between the thickness of an insulation tension coating and the tension that the insulation tension coating with the relevant thickness applies to the associated steel sheet. As shown in FIG. 3, with increasing thickness of the insulation tension coating, a tension (tension stress) applied to the steel sheet increases, and as a result, the grain oriented electrical steel sheet can have excellent magnetic properties (lower iron loss).

The thickness of the insulation tension coating is preferably not less than 1.0 μm because the grain oriented electrical steel sheet can have more excellent magnetic properties.

When the insulation tension coating is too thick, however, this causes a decrease in effective steel sheet volume of the grain oriented electrical steel sheet when used as a transformer, and also an iron loss reducing effect exerted by the tension stress is saturated, so that transformer properties may rather deteriorate. Thus, the insulation tension coating preferably has a thickness of preferably not more than 10.0 μm and more preferably not more than 5.0 μm.

For the thickness of the insulation tension coating, the cross-section is observed using an SEM (Scanning Electron Microscope) to measure the thickness, and the average of the measurements at given ten places is obtained.

<<Coating Formation Method>>

The method of forming the insulation tension coating is not particularly limited, and preferred examples thereof include a method involving applying a coating chemical solution onto the ceramic coating, followed by optionally drying, and then baking in a nitrogen atmosphere. This method is taken as an example and described below.

(Coating Chemical Solution)

The coating chemical solution preferably contains phosphoric acid and/or phosphate, and colloidal silica. Exemplary metal types of the phosphate that may be preferably used include Mg, Ca, Sr, Ba, Al and Mn.

For the phosphate, a phosphate having a low thermal expansion coefficient such as a magnesium phosphate or an aluminum phosphate is preferred because this leads to easier formation of the crystal phase.

As the phosphate, a primary phosphate (biphosphate) is advantageously used from the viewpoint of availability.

The coating chemical solution may further contain an M compound in addition to phosphoric acid and/or phosphate and colloidal silica. Specific examples of M include Y, Cr, Ti, Zr, Nb, V and W.

Examples of the Y compound include $Y_2O_3$.

An exemplary Cr compound is a chromic acid compound, specific examples thereof including chromic anhydride ($CrO_3$), a chromate, and a bichromate.

Examples of the Ti compound include $TiO_2$ and $Ti_2O_3$.

Examples of the Zr compound include $Zr(SO_4)_2 \cdot 4H_2O$ and $ZrO_2$.

Examples of the Nb compound include $Nb_2O_5$.

Examples of the V compound include $NH_4VO_3$ and $V_2O_5$.

Examples of the W compound include $K_2WO_4$ and $WO_3$.

A phosphate may be regarded as the M compound. For instance, exemplary Mg compounds include $Mg_3(PO_4)_2$, exemplary Ca compounds include $Ca_3(PO_4)_2$, and exemplary Al compounds include $AlPO_4$.

The amounts of respective components in the coating chemical solution are, for example, suitably adjusted to allow the resulting insulation tension coating to have the composition as described above.

(Coating Formation Condition)

The method of applying the coating chemical solution as above onto the coating layer A (ceramic coating) is not particularly limited and preferably utilizes an application roll for manufacturing cost reasons.

The baking temperature and the baking time are preferably 700° C. to 900° C. and 10 to 30 seconds, respectively, for the following reasons.

With a baking temperature of up to 900° C. and/or a baking time of up to 30 seconds, a reaction upon which precipitates are formed to cause a poor coating adhesion property between the ceramic coating and the insulation tension coating can be further suppressed, resulting in a further excellent coating adhesion property.

The coating chemical solution is dried in the first stage of formation of the insulation tension coating. With a baking temperature of not lower than 700° C. and/or a baking time of not less than 10 seconds, drying of the coating chemical solution sufficiently proceeds, so that moisture included in the coating chemical solution can adequately be removed, thus further improving a tension stress applied by the insulation tension coating to the steel sheet. In addition, oxidization of the ceramic coating caused by moisture can be suppressed during stress relief annealing.

The baking atmosphere is preferably a nitrogen atmosphere.

When the baking atmosphere is an air atmosphere, the ceramic coating may be easily oxidized due to the presence of moisture, oxygen and the like contained in the air; however, in a nitrogen atmosphere, oxidization of the ceramic coating is suppressed, resulting in a further excellent coating adhesion property.

<<Method of Having Peak Area Proportion of Not Less Than 30%>>

For the coating layer B (insulation tension coating), as the method of having a peak area proportion of not less than 30%, there are two possible methods.

The first method is increasing the amount of phosphoric acid and/or phosphate in the coating chemical solution (method 1).

Specifically, the amount of phosphoric acid and/or phosphate in the coating chemical solution is preferably not less than 20 mol % and more preferably not less than 30 mol % with respect to the total solids of the coating chemical solution.

In the method 1, when the amount of phosphoric acid and/or phosphate is too large, the structure called $Q^3$ becomes dominant, and the reactivity at the double bond portion of P=O increases. While the reaction at the double bond portion does not adversely affect the coating adhesion property, gas that is a reaction product may make holes in the insulation tension coating, resulting in poor tension.

Therefore, the amount of phosphoric acid and/or phosphate in the coating chemical solution is preferably not more than 50 mol % with respect to the total solids of the coating chemical solution.

The second method is crystallizing the insulation tension coating (method 2). Specifically, in the insulation tension coating, glass in which the bond of P—O—Si is dominant is separated into a crystal portion having the chain structure of $Q^2$ and a glass portion having the chain structure of —Si—O—Si—O—Si—. As a result, the oxidizing ability of the insulation tension coating can be decreased, leading to an excellent coating adhesion property.

Glass does not have a long period structure and naturally has a lower filling density than a crystal. Accordingly, when glass is crystallized, the Young's modulus of the insulation tension coating improves. Thus, the tension of the insulation tension coating improves, resulting in improved magnetic properties.

In the present invention, the method 1 and the method 2 are preferably used in combination as the method of having a peak area proportion of not less than 30%.

Exemplary methods of crystallizing the insulation tension coating include: a method involving increasing the baking temperature and the baking time (method A); and a method involving using laser light or photoinduction (method B).

In the case of the method A, the baking temperature is preferably 870° C. or higher.

In the case of the method B, after being baked, the insulation tension coating is locally applied with heat and/or strain by means of laser light or photoinduction and thereby crystallized. One specific example of laser light that may be preferably used is YAG laser light.

Of the methods A and B, the method B is preferred because crystal nuclei can be formed at regular intervals such that the insulation tension coating is uniformly crystallized, thus achieving further excellent coating adhesion property and magnetic properties.

The crystallinity has the upper limit that is determined depending on the composition. In the method A, if the baking temperature and/or the baking time is increased more than needed to crystallize the insulation tension coating to the upper limit of the crystallinity, the reaction between the insulation tension coating and the ceramic coating may be accelerated and rather cause deterioration of the properties.

In contrast, when the method B is employed, the negative effect as above can be avoided, and the crystallinity can be adjusted as desired.

<Stress Relief Annealing>

The grain oriented electrical steel sheet of the invention may sometimes be subjected to stress relief annealing by a demander or the like. The conditions for stress relief annealing are not particularly limited, and for instance, annealing is carried out in a nitrogen or another atmosphere at a temperature of 700° C. to 900° C. for 2 to 4 hours.

<Another Item>

To further improve the magnetic properties of the grain oriented electrical steel sheet of the invention, use may be made of the technique of refining magnetic domains of the grain oriented electrical steel sheet by forming a groove near a steel sheet surface such that the groove extends across the rolling direction of the grain oriented electrical steel sheet or by introducing a strain by laser irradiation or electron beam irradiation.

While a magnetic domain refining effect imparted by groove formation is maintained even after annealing, the degree of strain introduced by laser irradiation or electron beam irradiation is reduced through stress relief annealing carried out by a demander or the like, so that a resulting grain oriented electrical steel sheet is sometimes improper for wound core application, for example.

The grain oriented electrical steel sheet of the invention is, however, excellent in the coating adhesion property and the magnetic properties even when no stress relief annealing is carried out (for instance, in the case where the grain oriented electrical steel sheet is dedicated to pile iron cores). Therefore, in the present invention, when no stress relief annealing is carried out, the magnetic properties can be further improved by using the magnetic domain refining technique that introduces a strain.

EXAMPLES

The present invention will be specifically described below with reference to examples. However, the present invention is not limited thereto.

Test Example 1

<Production of Grain Oriented Electrical Steel Sheet>

A coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Coating Layer A: Ceramic Coating>>

Next, a TiN ceramic coating with a thickness of 0.20 μm was formed on the steel sheet by a CVD method. The amount of oxide in the ceramic coating was not more than 2 mass % in each case. For the CVD method, the thermal CVD method was used, and the coating formation was carried out under conditions of 1050° C. and 1000 Pa.

<<Coating Layer B: Insulation Tension Coating>>

Next, a coating chemical solution was applied using an application roll onto the ceramic coating formed on the steel sheet, dried, and then baked in a nitrogen atmosphere at a temperature shown in Table 1 below (in a range of 800° C. to 900° C.) for 15 seconds. Thus, an insulation tension coating with a thickness of 2.0 μm was formed.

(Coating Chemical Solution)

The coating chemical solution was prepared by selecting one or more from among phosphate, colloidal silica (AT-30 manufactured by ADEKA Corporation; average particle size, 10 nm) and an M compound and blending the selected component(s) such that the resulting insulation tension coating can have one of the compositions A to C shown in Table 1 below.

For the M compound, the following compounds were used.

Mg: $Mg_3(PO_4)_2$
Ca: $Ca_3(PO_4)_2$
Al: $AlPO_4$

The amount of phosphoric acid and/or phosphate in each coating chemical solution was within a range of 20 to 30 mol % with respect to the total solids of the coating chemical solution.

(Composition)

The compositions A to C shown in Table 1 below are as follows.

A: $40P_2O_5$-$55SiO_2$-$5MgO$
B: $40P_2O_5$-$55SiO_2$-$5CaO$
C: $40P_2O_5$-$55SiO_2$-$5Al_2O_3$

For instance, the composition A represents that the amount of $P_2O_5$ is "40 mass %," the amount of $SiO_2$ is "55 mass %," and the amount of MgO is "5 mass %" (the same applies to the others).

(Crystal Phase)

The crystal phase (phosphate crystal phase) of the insulation tension coating was identified using X-ray diffraction. The results are shown in Table 1 below. For the cases where the identification was not carried out, "–" was given in Table 1 below.

The quantity of the crystal phase of each inventive example was determined and as a result was within a range of 5 to 10 mass % in each case. As the quantitative method of the crystal phase, a quantitative method using X-ray diffraction and determining the quantity based on an integral intensity ratio of a crystalline component to a non-crystalline component was employed.

(Peak Area Proportion)

A $^{31}P$-NMR spectrum of the insulation tension coating was measured. The measurement conditions were as follows: the apparatus was VNS 600 manufactured by Agilent Technologies, Inc.; the measurement temperature was room temperature; the rotational speed was 7 kHz; and the reference sample was ammonium dihydrogenphosphate. One example of measured $^{31}P$-NMR spectra is shown in FIG. 4.

Gaussian fitting was performed on the measured $^{31}P$-NMR spectrum within a range of 0 to −60 ppm, and the proportion of the peak area in a range of −17 to −33 ppm with respect to the total peak area (i.e., peak area proportion) was obtained. The obtained peak area proportions are shown in Table 1 below.

<Evaluation>

Each of the obtained grain oriented electrical steel sheets was subjected to stress relief annealing in a nitrogen atmosphere at 800° C. for 3 hours. Thereafter, the evaluation was made as follows.

<<Coating Adhesion Property>>

The grain oriented electrical steel sheet having undergone stress relief annealing was wound around round bars having diameters different on a 5-millimeter basis, i.e., diameters of 5 mm, 10 mm, . . . (but including a round bar having a diameter of 3 mm) to determine the minimum diameter (unit: mm) from among diameters with which the ceramic coating did not peel off. The results are shown in Table 1 below. As the minimum diameter of diameters with which the coating does not peel off (i.e., no peel-off diameter) is smaller, the coating adhesion property after stress relief annealing can be rated as more excellent, and a no peel-off diameter of less than 30 mm is favorable.

<<Iron Loss $W_{17/50}$>>

For the grain oriented electrical steel sheet having undergone stress relief annealing, the iron loss $W_{17/50}$ was measured. The results are shown in Table 1 below. For the cases where the iron loss $W_{17/50}$ was not measured, "–" was given in Table 1 below. When the iron loss $W_{17/50}$ (unit: W/kg) is less than 0.80, the magnetic properties after stress relief annealing can be rated as excellent.

TABLE 1

| | | Coating layer B (Insulation tension coating) | | | Evaluation | | |
|---|---|---|---|---|---|---|---|
| | | | | | Coating | Iron | |
| No. | Composition | Baking temp. [° C.] | Crystal phase | Peak area proportion [%] | adhesion property [mm φ] | loss $W_{17/50}$ [W/kg] | Remarks |
| 1 | A | 800 | — | 25 | 45 | 0.88 | Comparative example |
| 2 | A | 820 | — | 25 | 45 | 0.86 | Comparative example |
| 3 | A | 840 | — | 24 | 50 | 0.85 | Comparative example |
| 4 | A | 860 | — | 26 | 55 | 0.83 | Comparative example |
| 5 | A | 880 | $Mg_2P_2O_7$ | 62 | 15 | 0.72 | Inventive example |
| 6 | A | 900 | $Mg_2P_2O_7$ | 62 | 20 | 0.75 | Inventive example |
| 7 | B | 800 | — | 27 | 45 | 0.90 | Comparative example |
| 8 | B | 820 | — | 27 | 45 | 0.88 | Comparative example |
| 9 | B | 840 | — | 28 | 55 | 0.87 | Comparative example |
| 10 | B | 860 | — | 29 | 55 | 0.86 | Comparative example |
| 11 | B | 880 | $Ca_2P_2O_7$ | 55 | 15 | 0.72 | Inventive example |
| 12 | B | 900 | $Ca_2P_2O_7$ | 55 | 20 | 0.75 | Inventive example |
| 13 | C | 800 | — | 15 | 50 | 0.83 | Comparative example |
| 14 | C | 820 | — | 17 | 45 | 0.83 | Comparative example |
| 15 | C | 840 | — | 20 | 30 | 0.80 | Comparative example |
| 16 | C | 860 | — | 21 | 35 | 0.81 | Comparative example |
| 17 | C | 880 | $Al_2P_2O_8$ | 52 | 10 | 0.74 | Inventive example |
| 18 | C | 900 | $Al_2P_2O_8$ | 55 | 10 | 0.76 | Inventive example |

As can be seen in Table 1 above, with the grain oriented electrical steel sheets of the inventive examples in which the peak area proportion is not less than 30%, the no peel-off diameter is up to 20 mm and thus small, which means an excellent coating adhesion property, and the iron loss $W_{17/50}$ is less than 0.80, which means excellent magnetic properties.

Test Example 2

<Production of Grain Oriented Electrical Steel Sheet>

A coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Coating Layer A: Ceramic Coating>>

Next, a TiN ceramic coating with a thickness of 0.20 μm was formed on the steel sheet by a CVD method. The amount of oxide in the ceramic coating was not more than 2 mass % in each case. For the CVD method, the thermal CVD method was used, and the coating formation was carried out under conditions of 1050° C. and 1000 Pa.

<<Coating Layer B: Insulation Tension Coating>>

Next, a coating chemical solution was applied using an application roll onto the ceramic coating formed on the steel sheet, dried, and then baked in a nitrogen atmosphere at 840° C. for 15 seconds. Thus, an insulation tension coating with a thickness of 2.0 μm was formed.

Further, the insulation tension coating was irradiated with laser light and thereby crystallized. For the laser light, YAG laser light was used.

(Coating Chemical Solution)

The coating chemical solution was prepared by selecting one or more from among phosphate, colloidal silica (AT-30 manufactured by ADEKA Corporation; average particle size, 10 nm) and an M compound and blending the selected component(s) such that the resulting insulation tension coating can have the composition as stated in Table 2 below.

For the M compound, the following compounds were used.

Mg: $Mg_3(PO_4)_2$
Ca: $Ca_3(PO_4)_2$
Sr: $SrHPO_4$
Ba: $Ba_3(PO_4)_2$
Al: $AlPO_4$
Y: $Y_2O_3$
Cr: $CrO_3$
Ti: $TiO_2$
Zr: $ZrO_2$
Mn: $Mn(NO_3)_2$
Nb: $Nb_2O_5$
V: $NH_4VO_3$
W: $WO_3$

The amount of phosphoric acid and/or phosphate in each coating chemical solution was within a range of 20 to 30 mol % with respect to the total solids of the coating chemical solution.

(Crystal Phase)

The crystal phase (phosphate crystal phase) of the insulation tension coating was identified and quantified in the same manners as in Test Example 1. The identification results are shown in Table 2 below. The quantity of the crystal phase was determined and as a result was within a range of 5 to 10 mass % in each case.
(Peak Area Proportion)

A $^{31}$P-NMR spectrum of the insulation tension coating was measured in the same manner as in Test Example 1 to obtain the peak area proportion. The results are shown in Table 2 below.
<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 2 below.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.
<<Coating Layer A: Ceramic Coating>>

Next, a ceramic coating having the composition shown in Table 3 below was formed to have a thickness shown in Table 3 below on the steel sheet by a CVD method or a PVD method. The amount of oxide in the ceramic coating was not more than 2 mass % in each case.

For the CVD method, the thermal CVD method was used, and the coating formation was carried out under conditions

TABLE 2

| | Coating layer B (Insulation tension coating) | | | Evaluation | | |
| --- | --- | --- | --- | --- | --- | --- |
| No. | Composition [mass %] | Crystal phase | Peak area proportion [%] | Coating adhesion property [mm φ] | Iron loss $W_{17/50}$ [W/kg] | Remarks |
| 1 | 40$P_2O_5$-55$SiO_2$-5MgO | $Mg_2P_2O_7$ | 65 | 10 | 0.70 | Inventive example |
| 2 | 40$P_2O_5$-55$SiO_2$-5CaO | $Ca_2P_2O_7$ | 59 | 10 | 0.71 | Inventive example |
| 3 | 40$P_2O_5$-55$SiO_2$-5SrO | $Sr_2P_2O_7$ | 57 | 15 | 0.74 | Inventive example |
| 4 | 40$P_2O_5$-55$SiO_2$-5BaO | $Ba_2P_2O_7$ | 52 | 20 | 0.76 | Inventive example |
| 5 | 40$P_2O_5$-55$SiO_2$-5$Al_2O_3$ | $Al_2P_2O_8$ | 62 | 5 | 0.70 | Inventive example |
| 6 | 40$P_2O_5$-55$SiO_2$-5$Y_2O_3$ | $Y_2P_2O_8$ | 60 | 5 | 0.73 | Inventive example |
| 7 | 40$P_2O_5$-55$SiO_2$-5$Cr_2O_3$ | $Cr_2P_2O_8$ | 55 | 10 | 0.74 | Inventive example |
| 8 | 40$P_2O_5$-55$SiO_2$-5$TiO_2$ | $Ti_3P_4O_{16}$ | 70 | 5 | 0.68 | Inventive example |
| 9 | 40$P_2O_5$-55$SiO_2$-5$ZrO_2$ | $Zr_3P_4O_{16}$ | 68 | 5 | 0.70 | Inventive example |
| 10 | 40$P_2O_5$-55$SiO_2$-5$MnO_2$ | $Mn_3P_4O_{18}$ | 67 | 5 | 0.74 | Inventive example |
| 11 | 40$P_2O_5$-55$SiO_2$-5$Nb_2O_5$ | $NbPO_5$ | 62 | 5 | 0.68 | Inventive example |
| 12 | 40$P_2O_5$-55$SiO_2$-5$V_2O_5$ | $VPO_5$ | 63 | 5 | 0.69 | Inventive example |
| 13 | 40$P_2O_5$-55$SiO_2$-5$WO_3$ | $WP_2O_8$ | 64 | 5 | 0.66 | Inventive example |

As can be seen in Table 2 above, with the grain oriented electrical steel sheets of the inventive examples in which the peak area proportion is not less than 30%, the no peel-off diameter is up to 20 mm and thus small, which means an excellent coating adhesion property, and the iron loss $W_{17/50}$ is less than 0.80, which means excellent magnetic properties.

Test Example 3

<Production of Grain Oriented Electrical Steel Sheet>

A coating layer A (ceramic coating) and a coating layer B (insulation tension coating) were formed in this order on a steel sheet as described below, thereby obtaining a grain oriented electrical steel sheet.
<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

of 1050° C. and 1000 Pa. For the PVD method, the ion plating method was used, and the coating formation was carried out under conditions of 450° C., 3 Pa and a bias voltage of −20 V.
<<Coating Layer B: Insulation Tension Coating>>

Next, a coating chemical solution was applied using an application roll onto the ceramic coating formed on the steel sheet, dried, and then baked in a nitrogen atmosphere at 840° C. for 15 seconds. Thus, an insulation tension coating with a thickness of 2.0 μm was formed.

Further, the insulation tension coating was irradiated with laser light and thereby crystallized. For the laser light, YAG laser light was used.

For the coating chemical solution, the same coating chemical solution as that of No. 1 in Test Example 2 was used. The crystal phase and the peak area proportion of the formed insulation tension coating (composition: 40$P_2O_5$-55$SiO_2$-5MgO) were also the same as those of No. 1 in Test Example 2.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 3 below.

TABLE 3

| No. | Coating layer A (Ceramic coating) | | | Evaluation | | Remarks |
|---|---|---|---|---|---|---|
| | Coating formation method | Composition | Thickness [μm] | Coating adhesion property [mm φ] | Iron loss $W_{17/50}$ [W/kg] | |
| 1 | CVD | TiN | 0.01 | 20 | 0.76 | Inventive example |
| 2 | CVD | TiN | 0.10 | 5 | 0.71 | Inventive example |
| 3 | CVD | TiN | 1.00 | 3 | 0.58 | Inventive example |
| 4 | CVD | CrN | 0.01 | 15 | 0.76 | Inventive example |
| 5 | CVD | CrN | 0.10 | 5 | 0.72 | Inventive example |
| 6 | CVD | CrN | 1.00 | 3 | 0.60 | Inventive example |
| 7 | PVD | TiN | 0.01 | 15 | 0.75 | Inventive example |
| 8 | PVD | TiN | 0.10 | 3 | 0.70 | Inventive example |
| 9 | PVD | TiN | 1.00 | 3 | 0.55 | Inventive example |
| 10 | PVD | TiAlN | 0.10 | 3 | 0.70 | Inventive example |
| 11 | PVD | TiSiN | 0.10 | 5 | 0.70 | Inventive example |
| 12 | PVD | TiZrN | 0.10 | 5 | 0.71 | Inventive example |
| 13 | PVD | TiMoN | 0.10 | 10 | 0.69 | Inventive example |
| 14 | PVD | TiYN | 0.10 | 5 | 0.69 | Inventive example |
| 15 | PVD | TiNbN | 0.10 | 5 | 0.66 | Inventive example |
| 16 | PVD | TiWN | 0.10 | 10 | 0.71 | Inventive example |
| 17 | PVD | TiC | 0.10 | 15 | 0.70 | Inventive example |
| 18 | PVD | TiCN | 0.10 | 10 | 0.74 | Inventive example |
| 19 | PVD | TiCrN | 0.10 | 3 | 0.69 | Inventive example |
| 20 | PVD | AlCrN | 0.10 | 3 | 0.67 | Inventive example |
| 21 | PVD | SiCrN | 0.10 | 5 | 0.70 | Inventive example |
| 22 | PVD | ZrCrN | 0.10 | 10 | 0.70 | Inventive example |
| 23 | PVD | MoCrN | 0.10 | 10 | 0.71 | Inventive example |
| 24 | PVD | YCrN | 0.10 | 5 | 0.70 | Inventive example |
| 25 | PVD | NbCrN | 0.10 | 10 | 0.74 | Inventive example |
| 26 | PVD | WCrN | 0.10 | 10 | 0.73 | Inventive example |

As can be seen in Table 3 above, with the grain oriented electrical steel sheets of the inventive examples, the no peel-off diameter is less than 30 mm, which means an excellent coating adhesion property, and the iron loss $W_{17/50}$ is less than 0.80, which means excellent magnetic properties.

In Table 3 above, when the inventive examples with the ceramic coatings having a thickness of 0.10 μm are compared, those inventive examples in which the ceramic coatings have either of the compositions TiCrN and AlCrN show further excellent coating adhesion property and magnetic properties.

Test Example 4

<Production of Grain Oriented Electrical Steel Sheet>

A coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.20 mm.

<<Coating Layer A: Ceramic Coating>>

Next, an AlCrN ceramic coating with a thickness of 0.10 μm was formed on the steel sheet by a PVD method. The amount of oxide in the ceramic coating was not more than 2 mass % in each case. For the PVD method, the ion plating method was used, and the coating formation was carried out under conditions of 450° C., 3 Pa and a bias voltage of −20 V.

<<Coating Layer B: Insulation Tension Coating>>

Next, a coating chemical solution was applied using an application roll onto the ceramic coating formed on the steel sheet, dried, and then baked in a nitrogen atmosphere at 840° C. for 15 seconds. Thus, an insulation tension coating with a thickness shown in Table 4 below was formed.

Further, the insulation tension coating was irradiated with laser light and thereby crystallized. For the laser light, YAG laser light was used.

For the coating chemical solution, the same coating chemical solution as that of No. 1 in Test Example 2 was used. The crystal phase and the peak area proportion of the formed insulation tension coating (composition: $40P_2O_5$-$55SiO_2$-$5MgO$) were also the same as those of No. 1 in Test Example 2.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 4 below.

TABLE 4

| No. | Coating layer B (Insulation tension coating) Thickness [μm] | Evaluation | | Remarks |
|---|---|---|---|---|
| | | Coating adhesion property [mm φ] | Iron loss $W_{17/50}$ [W/kg] | |
| 1 | 1.0 | 3 | 0.72 | Inventive example |
| 2 | 2.0 | 3 | 0.65 | Inventive example |
| 3 | 4.0 | 3 | 0.61 | Inventive example |
| 4 | 6.0 | 3 | 0.58 | Inventive example |
| 5 | 8.0 | 5 | 0.56 | Inventive example |
| 6 | 10.0 | 5 | 0.55 | Inventive example |

As can be seen in Table 4 above, with the grain oriented electrical steel sheets of the inventive examples, the no peel-off diameter is less than 30 mm, which means an excellent coating adhesion property, and the iron loss $W_{17/50}$ is less than 0.80, which means excellent magnetic properties.

In Table 4 above, comparison between the inventive examples reveals that there is the tendency in which as the insulation tension coating has a larger thickness, the magnetic properties are more excellent.

REFERENCE SIGNS LIST

1: steel sheet
2: forsterite coating
3: insulation tension coating

4: ceramic coating
T$_2$: forsterite coating thickness
T$_3$: insulation tension coating thickness
T$_4$: ceramic coating thickness

The invention claimed is:

1. A grain oriented electrical steel sheet, comprising:
a steel sheet;
a coating layer A that is a ceramic coating containing an oxide in an amount of less than 30 mass % and disposed on the steel sheet; and
a coating layer B that is an insulation tension coating containing an oxide and disposed on the coating layer A,
wherein when Gaussian fitting is performed on a $^{31}$P-NMR spectrum of the coating layer B within a range of 0 to −60 ppm, a peak area in a range of −17 to −33 ppm accounts for 30% or more of a total peak area.

2. The grain oriented electrical steel sheet according to claim 1,
wherein the coating layer B includes not less than 5 mass % of crystal phase, and
wherein the crystal phase is a phosphate crystal phase.

3. The grain oriented electrical steel sheet according to claim 1,
wherein the coating layer A has a thickness of not less than 0.01 μm, and
wherein the coating layer A has a thickness of not more than 0.30 μm.

4. The grain oriented electrical steel sheet according to claim 1,
wherein the coating layer B has a thickness of not less than 1.0 μm, and
wherein the coating layer B has a thickness of not more than 10.0 μm.

5. The grain oriented electrical steel sheet according to claim 1,
wherein the coating layer A contains a nitride or a carbonitride.

6. The grain oriented electrical steel sheet according to claim 2,
wherein the coating layer A has a thickness of not less than 0.01 μm, and
wherein the coating layer A has a thickness of not more than 0.30 μm.

7. The grain oriented electrical steel sheet according to claim 2,
wherein the coating layer B has a thickness of not less than 1.0 μm, and
wherein the coating layer B has a thickness of not more than 10.0 μm.

8. The grain oriented electrical steel sheet according to claim 3,
wherein the coating layer B has a thickness of not less than 1.0 μm, and
wherein the coating layer B has a thickness of not more than 10.0 μm.

9. The grain oriented electrical steel sheet according to claim 6,
wherein the coating layer B has a thickness of not less than 1.0 μm, and
wherein the coating layer B has a thickness of not more than 10.0 μm.

10. The grain oriented electrical steel sheet according to claim 2,
wherein the coating layer A contains a nitride or a carbonitride.

11. The grain oriented electrical steel sheet according to claim 3,
wherein the coating layer A contains a nitride or a carbonitride.

12. The grain oriented electrical steel sheet according to claim 4,
wherein the coating layer A contains a nitride or a carbonitride.

13. The grain oriented electrical steel sheet according to claim 6,
wherein the coating layer A contains a nitride or a carbonitride.

14. The grain oriented electrical steel sheet according to claim 7,
wherein the coating layer A contains a nitride or a carbonitride.

15. The grain oriented electrical steel sheet according to claim 8,
wherein the coating layer A contains a nitride or a carbonitride.

16. A grain oriented electrical steel sheet producing method of producing the grain oriented electrical steel sheet according to claim 1,
wherein the coating layer B is formed by applying a coating chemical solution onto the coating layer A and baking the coating chemical solution in a nitrogen atmosphere,
wherein an amount of phosphoric acid and/or phosphate in the coating chemical solution is not less than 20 mol % with respect to total solids of the coating chemical solution, and
wherein a temperature of the baking is 870° C. or higher or the baking is followed by crystallization using laser light, thereby obtaining the coating layer B.

17. The grain oriented electrical steel sheet according to claim 1, having an iron loss $W_{17/50}$ of less than 0.80 W/Kg.

18. The grain oriented electrical steel sheet according to claim 1, wherein the oxide of element other than P and Si is selected from MgO, CaO, SrO, BaO, Al$_2$O$_3$, Y$_2$O$_3$, Cr$_2$O$_3$, TiO$_2$, ZrO$_2$, MnO$_2$, Nb$_2$O$_5$, V$_2$O$_5$, and WO$_3$.

19. The grain oriented electrical steel sheet according to claim 1, wherein the coating layer B contains an oxide, an amount of oxide of phosphorus in the coating layer B is from 25 to 55 mass %, an amount of oxide of silicon in the coating layer B is from 42 to 58 mass % and an amount of oxide of element other than P and Si in the coating layer B is from 2 to 18 mass %.

* * * * *